United States Patent
DeVey (10) Patent No.: US 7,053,648 B2
(45) Date of Patent: May 30, 2006

(54) DISTRIBUTED, LOAD SHARING POWER SUPPLY SYSTEM FOR IC TESTER

(75) Inventor: William DeVey, Beaverton, OR (US)

(73) Assignee: Credence Systems Corporation, Milpitas, CA (US)

(*) Notice: Subject to any disclaimer, the term of this patent is extended or adjusted under 35 U.S.C. 154(b) by 0 days.

(21) Appl. No.: 11/024,528

(22) Filed: Dec. 28, 2004

(65) Prior Publication Data

US 2005/0174137 A1 Aug. 11, 2005

Related U.S. Application Data

(63) Continuation-in-part of application No. 10/458,342, filed on Jun. 9, 2003, now abandoned.

(51) Int. Cl.
*G01R 31/26* (2006.01)
(52) U.S. Cl. .................................. 324/765; 324/73.1
(58) Field of Classification Search .................. None
See application file for complete search history.

(56) References Cited

U.S. PATENT DOCUMENTS

| | | | |
|---|---|---|---|
| 5,951,705 A * | 9/1999 | Arkin et al. ................ | 714/738 |
| 6,028,439 A | 2/2000 | Arkin et al. | |
| 6,202,186 B1 | 3/2001 | Oonk | |
| 6,476,628 B1 | 11/2002 | LeColst | |
| 6,489,797 B1 | 12/2002 | MacDonald et al. | |

* cited by examiner

*Primary Examiner*—Minh N. Tang
(74) *Attorney, Agent, or Firm*—John Smith-Hill; Smith-Hill and Bedell (57) ABSTRACT

An integrated circuit (IC) tester includes a set of power modules mounted in a test head, each contacting a device interface board (DIB). The DIB provides power paths for delivering an output current generate by each power module to a power input terminals of one or more IC devices under test (DUTs). Power modules that supply current to the same set of DUTs communicate with one another though conductive paths provided by the DIB to ensure that all power modules begin supplying load current to that set of DUTs at the same time and to ensure that all power modules supply substantially the same amount of load current to those DUTs.

25 Claims, 6 Drawing Sheets

FIG. 9

DISTRIBUTED, LOAD SHARING POWER SUPPLY SYSTEM FOR IC TESTER

CROSS-REFERENCE TO RELATED APPLICATIONS

This application is filed as a continuation-in-part patent application Ser. No. 10/458,342 filed Jun. 9, 2003 abandoned, the entire disclosure of which is hereby incorporated by reference herein for all purposes.

Subject matter disclosed in this application might be considered to be related to subject matter disclosed in Patent Application No. 11/024,536 filed Dec. 28, 2004, the entire disclosure of which is hereby incorporated by reference herein for all purposes.

BACKGROUND OF THE INVENTION

1. Field of the Invention

The present invention relates in general to integrated circuit testers and in particular to a distributed, load-sharing power supply for an integrated circuit tester 2. Description of Related Art As integrated circuit (IC) channel widths continue to decrease, so too have IC supply voltages. With the reduction in supply voltages, and with the increasing numbers of transistors being included in ICs, new generations of ICs demand increasingly larger amounts of current to satisfy their power needs. To test low-voltage, high current ICs, an IC tester must therefore be capable of supplying substantial amounts of current to IC devices under test (DUTs).

Patent Application No. 11/024,536 discloses an apparatus for testing an integrated circuit device under test (DUT) having a power input terminal for receiving current for powering the DUT, input terminals for receiving test signals, and output terminals for forwarding output signals that the DUT generates in response to the test signals, the apparatus comprising a plurality of tester channels for generating the test signals and for processing the DUT's output signals to determine how the DUT's output signals behave, a plurality of power modules, wherein each power module has a power output terminal and includes a power supply having a power supply output terminal connected to the power module's power output terminal, and the power supply is operative to develop a supply voltage at the power supply output terminal and to deliver an output current to the power supply output terminal, and a device interface structure for delivering the test signals from the tester channels to the DUT's input terminals, for delivering the DUT's output signals to the tester channels, and for delivering output current from the power output terminal of each power module to the DUT's power input terminal.

Since voltage differences between high and low logic levels in a low voltage IC are small, an IC tester's power supply system must also be capable of tightly regulating the voltage at DUT's power input terminals. In digital ICs employing synchronous logic, state changes in transistors are synchronized to edges of clock signals. A CMOS IC typically draws a large amount of current when transistors change state during a first part of each clock signal cycle and then draws relatively little current during the remaining portion of each clock signal cycle. The highly cyclic nature of a CMOS IC's current demand makes it difficult for a power supply to regulate the voltage at the IC's power input terminal, particularly for a high current IC where modest impedances between the power supply and the IC's power input terminal can produce a large periodic variation in supply voltage at the power input terminal. Such voltage variation can be reduced to acceptable limits by connecting a large regulating capacitor to the IC's power input terminal, but as IC current demand continues to increase, the amount of capacitance needed to provide adequate voltage regulation becomes impractically large.

What is needed is a power supply system for an integrated circuit tester capable of supplying large currents to power input terminals of one or more IC devices under test through very low impedance paths so that relatively small capacitance at the DUT power input terminals can adequately regulate supply voltages at those terminals despite wide variations in the IC's current demand.

BRIEF SUMMARY OF THE INVENTION

According to the present invention there is provided an improved apparatus for testing an integrated circuit device under test (DUT) having a power input terminal for receiving current for powering the DUT, input terminals for receiving test signals, and output terminals for forwarding output signals that the DUT generates in response to the test signals, the apparatus comprising a plurality of tester channels for generating the test signals and for processing the DUT's output signals to determine how the DUT's output signals behave, a plurality of power modules, wherein each power module has a power output terminal and includes a power supply having a power supply output terminal connected to the power module's power output terminal, and the power supply is operative to develop a supply voltage at the power supply output terminal and to deliver an output current to the power supply output terminal, and a device interface structure for delivering the test signals from the tester channels to the DUT's input terminals, for delivering the DUT's output signals to the tester channels, and for delivering output current from the power output terminal of each power module to the DUT's power input terminal, and wherein the improvement resides in that the device interface structure includes a control signal conductor for delivering a control signal to at least some of the power modules, and each power module that receives the control signal is responsive to the control signal to adjust at least one of the supply voltage developed at the power module's power output terminal and the output current delivered to the power module's power output terminal.

An integrated circuit (IC) tester in accordance with a preferred embodiment of the invention includes a set of power modules mounted in a test head. Each power module contacts a device interface board (DIB) providing signal paths for delivering an output current generated by the power module to a power input terminals of one or more IC devices under test (DUTs).

The power modules that supply current to the same set of DUTs communicate with one another though conductive paths provided by the DIB to ensure that all power modules begin supplying load current to the DUTs at the same time and to ensure that each power module supplies substantially the same amount of load current to the DUT.

The power modules reside on cards inserted in slots of a power distribution board or motherboard for delivering power to each power module from a main power supply. The motherboard also includes a set of busses enabling each module to communicate with a controller through digital signals conveyed on the busses, suitably a field programmable gate array mounted on the motherboard, providing an interface between the power modules and an external host computer. The controller uses the digital signals to set the output voltage of each power module and to tell the modules when to begin supplying current to the DUTs, and each power module uses the digital signals to send data back to the controller including data indicting magnitudes of its supply voltage and output current.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION OF THE INVENTION

The invention relates to a power supply system for an integrated circuit (IC) tester. While the specification describes at least one exemplary embodiment of the invention considered to be a best mode of practicing the invention, the invention is not limited to the exemplary embodiment(s) described below or to the manner in which the exemplary embodiments operate.

An IC tester in accordance with the invention includes a test head holding a set of connectors for linking a set of tester channels to pads on a device interface board (DIB) that are linked to terminals of one or more IC devices under test (DUTs) mounted on the DIB. Each tester channel may either send a test signal to a DUT input terminal or may sample a DUT output signal appearing at a DUT output terminal to determine its state. A set of power supply modules, mounted in the test head close to the DIB, supply power and ground through connectors to other pads on the DIB. The DIB includes buses for linking those pads to the power and ground terminals of each DUT. With the power supply modules mounted in the test head, path distances between the power module and the DUTs are short and of very low impedance.

The power supply system in accordance with the invention employs several smaller power modules, rather than one large power module, to supply power to the DUTs so that it can distribute power to several points on the DIB and so that no one power module-to-DIB connector need carry the entire current load drawn by the DUTs. Many smaller power modules distributed on the test head are also easier to cool than one larger power supply module. The invention relates in part to the manner in which the power supply modules share the load drawn by the DUTs.

Figure 1:
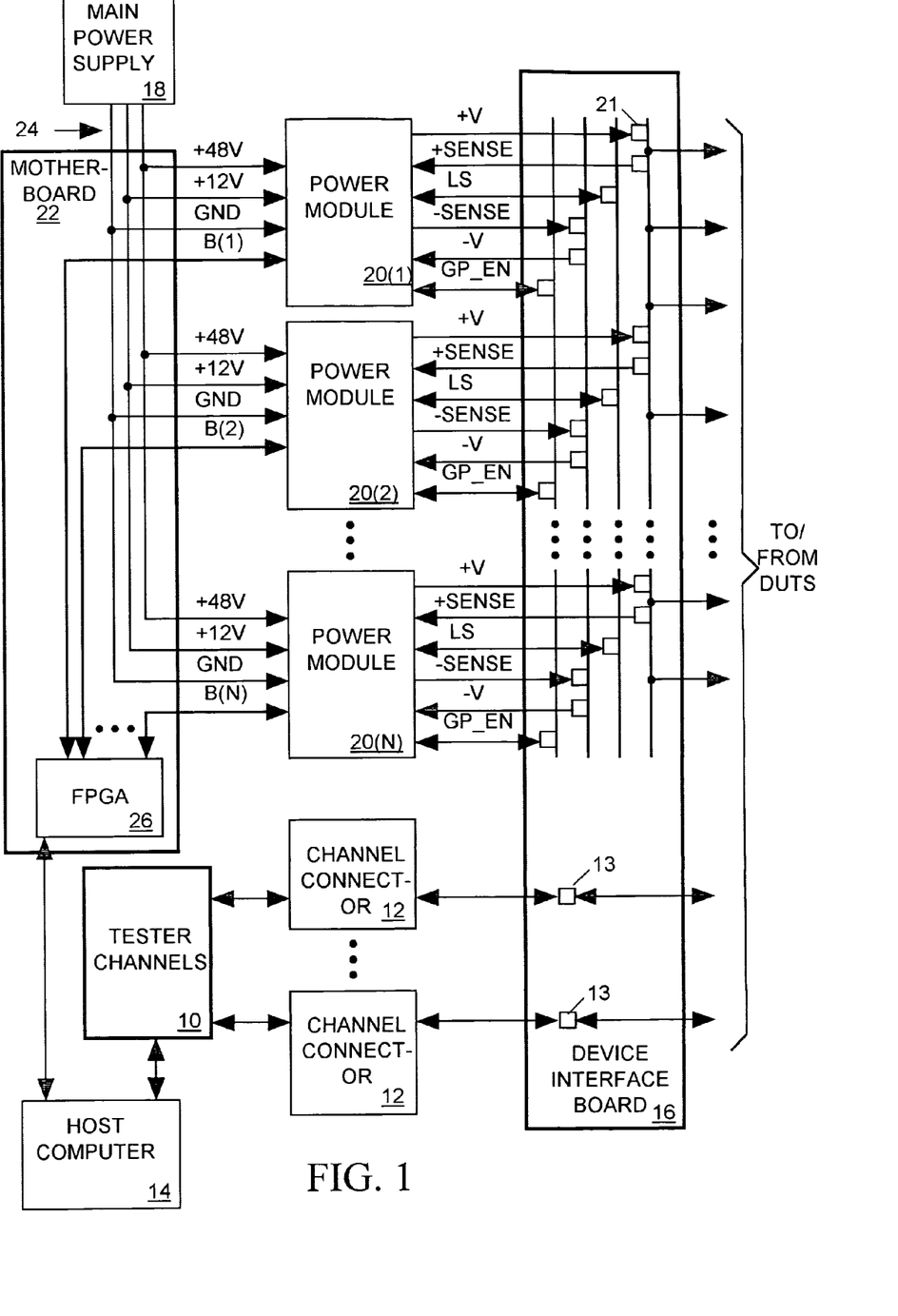
FIG. 1 depicts in block diagram form an integrated circuit tester in accordance with a preferred embodiment of the invention.

FIG. 1 depicts an example IC tester in accordance with the invention in block diagram form. The IC tester includes a set of conventional tester channels 10 programmed by a host computer 14 to communicate with one or more integrated circuit devices under test (DUTs) mounted on device interface board (DIB) 16 via connectors 12 that contact pads 13 on DIB 16. Tester channels may be implemented by printed circuit boards that may be mounted in a chassis remote from the test head and are linked to connectors 12 through signal cables.

A set of N power modules 20(1)–20(N) for supplying power to the DUTs are provided on cards inserted into card connectors on a power distribution board or motherboard 22 within the tester's test head. Each power module card holds two power modules 20 near DIB 16. Power distribution board includes another bus 24 for delivering +12V and +48V power and ground from a main power supply 18 remote from the test head to power modules 20. Power distribution board 22 also includes a set of buses B(1)–B(N) permitting a field programmable gate array (FPGA) 26 mounted on motherboard 22 and programmed by host computer 14 to communicate with power modules 20. A line 25 on power distribution board 22 also conveys a control signal from FPGA 26 enabling it to turn main power supply 18 on and off.

Pogo pin connectors on the upper edge of each power module card deliver power (+V) and ground (−V) from the power module to pads 21 on the surface of DIB 16. Pads 21 are connected to power and ground buses on DIB 16 for delivering power and ground to the DUTs' power and ground terminals. The DIB power and ground bus voltages supplied to the DUT power and ground terminals are fed back to power modules 20 via +SENSE and −SENSE buses formed on DIB 16. DIB 16 may include more than one power and ground bus so that it need not necessarily connect the power and ground terminals of all DUTs to the same power and ground bus. Thus not all power modules 20(1)–20(N) need share the same load. Groups of power modules 20(1)–20(N) that do share the same load communicate with one another through load share (LS) and group enable (GP_EN) buses also formed on DIB 16.

Figure 2:
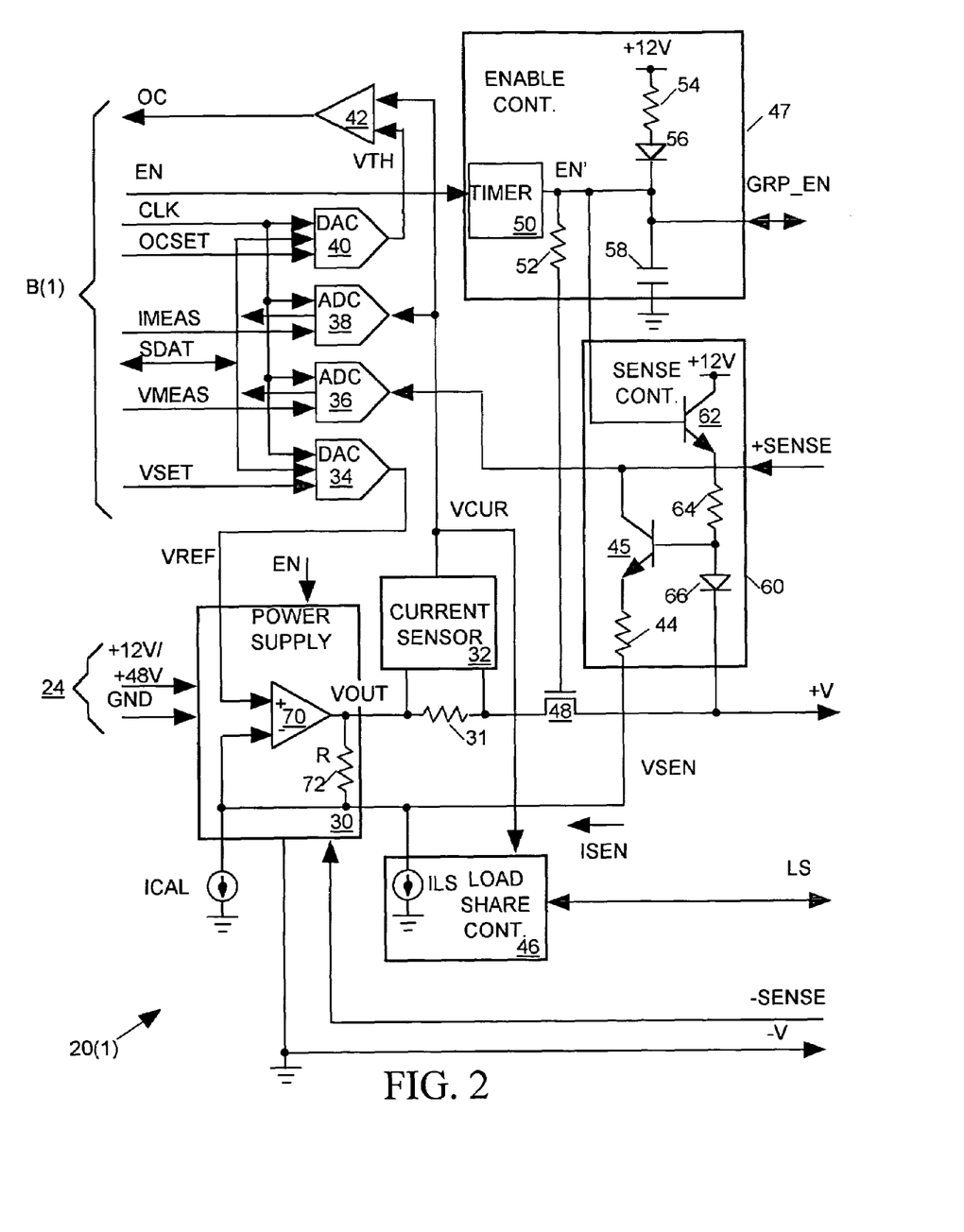
FIG. 2 depicts in block and schematic diagram form a preferred embodiment of one of the power modules of FIG. 1.

FIG. 2 illustrates power module 20(1) of FIG. 1 in more detailed block diagram form; modules 20(2)–20(N) are similar. Power module 20(1) includes a power supply 30, suitably a DC/DC converter, for supplying load current to the DUTs. Power supply 30 converts either the +12V or +48V supply voltage arriving on power bus 24 to an adjustable output voltage VOUT, and the output current of power supply 30 is delivered to the +V bus on DIB 14 through a small resistor 31 and an FET transistor 48.

Each power module 20 has force and return lines connected to VOUT and ground of power supply 30. The force and return lines are designated +V and −V respectively in FIG. 2, but it will be appreciated that, depending on the test involved, the force line might be at a negative voltage relative to the return line.

A current sensor 32 generates a signal VCURR of voltage proportional to the output current of power supply 30 developed across a small (suitably, 1.6 mOHM) resistor 31 and +SENSE signal indicating the supply voltage at the DUTs' power input terminals provides an input to an analog-to-digital converter ADC 36. An output signal VREF of a digital-to-analog converter (DAC) 34 establishes a nominal set point voltage for VOUT of power supply 30. Another ADC 38 monitors the power supply's output current VCUR sensed by current sensor 32. A DAC 40 produces a voltage signal VTH proportional to the maximum allowable current of power supply 30, and a comparator 42 compares the VTH and VCURR signal voltages to produce an output signal OC indicating whether the power supply is producing current above its maximum allowable level. A single serial data line SDAT of bus B(1) allows FPGA 16 (FIG. 1) to transmit data to DACs 34 and 40 and to receive data from ADCs 36 and 38. Another line (CLK) of bus B(1) provides a signal for clocking data into or out of DACs 34 and 40 and ADCs 36 and 38. A set of control lines VSET, OCSET, VMEAS, and IMEAS select the particular DAC 34 or 40 or ADC 36 or 38, respectively, to receive or transmit data via the SDAT line.

The +SENSE bus on DIB 16 (FIG. 1) line drives an input of power supply 30 via a resistor 44 and a transistor 45. During a test, power supply 30 monitors the voltage VSEN appearing at that input and increases or decreases output voltage VOUT relative to VREF when VSEN indicates that the +SENSE line voltage is too low or too high. The feedback provided by the +SENSE line thus holds the DUT supply voltage at the desired level.

The signal conveyed on load share bus LS is proportional to the output current of the power supply 30 within the particular one of the power modules 20 presently supplying the largest amount of current to the DUT power bus +V. During a test, a conventional load share controller 46 monitors both the LS signal and the VCUR signal representing the output current of local power supply 30. When the local power supply 30 produces less current than that indicated by the LS line, it pulls down on the VSEN input to the local power supply 30, causing the power supply 30 to increase its VOUT output, thereby increasing the share of the load current it supplies to the DUTs. Thus the feedback provided by the LS signal helps balance the loads on all power modules 20 sharing the same load.

An enable signal EN input to power supply 30 from FPGA 26 (FIG. 1) turns on the power supply. Enable signal EN also provides an input to an enable control circuit 47. When the EN signal is not asserted, enable control circuit 47 pulls down on a gate of transistor 48, turning off the transistor, thereby preventing power supply 30 from supplying any current to the load. The EN signal, when not asserted, also pulls down on the GP_EN bus connected through a diode 56. Since the GRP_EN bus is linked to the gate of the FET transistor 48 in every other power module sharing the same load, the enable control circuit 47 of module 20(1) also prevents the power supplies 30 in the other power modules from supplying any current to the load. Thus no power module of a group of power modules 20 sharing the same load can supply current to the DUTs when the EN signal to any power module of the group is not asserted.

Enable control circuit 47 includes a timer circuit 50 that holds its output signal EN' low when enable signal EN is de-asserted. The EN' signal drives the gate of transistor 48 though a resister 52. Thus, the EN' signal pulls down on the gate of FET transistor 48 to keep it off until the EN signal is asserted. A resistor 54 also links the EN' signal output of timer 50 to a +12V supply which weakly pulls up on EN', but when the EN signal is not asserted, timer 50 pulls down harder on EN' to keep it low. When FPGA 26 thereafter asserts the EN signal, power supply 30 drives its output voltage VOUT high, but since timer 50 continues to pull down on EN' for 10 milliseconds after the EN signal is asserted, transistor 48 stays off and power supply 30 does not initially supply any current to DIB 16 via the load line +V. The 10 msec delay allows power supply 30 sufficient time to ramp its output voltage VOUT up to the proper operating level before transistor 48 connects the converter to the +V bus.

Thus ten milliseconds after FPGA 16 asserts the EN signal timer 50 stops pulling down on the EN' signal. However since diode 56 also couples the EN' signal line to the group enable bus GRP_EN, and since the EN' outputs of timers 50 in all power modules 20 sharing the same load are connected to the same GRP_EN line through a similar diode, the EN' signal will not begin to swing high until the timer 50 in every other power module has timed out and stops pulling down on the GRP_EN bus. Thus only after the timer 50 in every power module 20 sharing the same load has timed out following assertion of its local enable signal EN, is the resistor 54 in each power module 20 allowed to pull the local EN' signal up to turn on transistor 48 and connect the output of the local power supply 30 to the +V bus. Thus all of the power modules sharing the same load are connected to the +V bus at the same time even though their EN signals may have been asserted at somewhat different times, and even though there may be differences in their response times to the EN signals.

Once all power modules allow the GRP_EN bus voltage to float, the pull up resistor 54 in each module ramps the EN' signal voltage up over a 3–4 msec period as it charges a capacitor 58 coupling the GRP_EN signal to ground. As the EN' signal ramps up, it slowly turns on transistor 48 allowing the local power supply 30 to slowly increase the load current it supplies to DIB 16 until transistor 48 is fully on. This slow ramp up of the load current allows load share controller 46 to prevent large temporary imbalances in load currents supplied by power modules 20 so that no power supply 30 within any power module 20 will be temporarily overloaded.

At the end of a test, FPGA 26 (FIG. 1) de-asserts the EN signal input to each power module, causing its power supply 30 to turn off its output VOUT. Each power supply 30 has internal overload protection circuits that will shut down any power supply 30 that may otherwise be slow to turn off before overload conditions become problematic.

Power supply 30 includes a power amplifier 70 having VREF at its non-inverting input and having its output VOUT fed back to its inverting input though a resistor 72. Resistor 72 keeps the control loop closed should the external loop be broken for any reason. Power amplifier 70 adjusts VOUT to keep input voltage VSEN substantially equal to REF. VOUT is higher than VSEN by the amount of voltage drop across resistor 44. During a calibration process, a manually adjustable current source ICAL linked to the inverting input of amplifier 70 allows an operator to adjust the voltage drop across resistor 44 to compensate for differences in VOUT between power supplies 30 of different power modules 20 due to variations in VREF or other factors.

A sense control circuit 60 also draws a current ISEN through resistor 44 that can alter the value of VOUT relative to VREF to compensate for differences between VREF and the voltage actually delivered to the DUTs as indicated by the +SENSE line. Load share control circuit 46 also draws a current ILS through resistor 44 adjusted to increase or decrease VOUT as necessary to ensure that power supply 30 supplies its appropriate share of DUT load current. VOUT is therefore:

$$VOUT = VREF + R(ICAL + ILS + ISEN)$$

where R is the resistance of resistor 44.

As mentioned above, the load share controllers 46 of all power modules 20 driving the same load are connected to the same load share bus LS on DIB 16 (FIG. 1). The voltage on the LS bus is proportional to the magnitude of the current produced by the power supply 30 of the power module supplying the largest amount of current to the DUT load. The load share controller 46 in each power module 20 compares VCUR to the LS signal to determine whether the local power supply 30 is supplying more or less than the amount of current indicated by the LS signal. When load share controller 46 detects power supply 30 is supplying more current than indicated by the LS signal, it drives the LS signal to a level proportional to VCUR and also decreases the amount of current ILS it draws through resistor 44, thereby causing amplifier 70 to lower the voltage of VOUT so that it supplies less current to the load. When load share controller 46 detects from the LS and VCUR signals that amplifier 70 is supplying less current than indicated by the LS signal, it increases the amount of current ILS it draws through resistor 44, thereby pulling down on the VSEN line. This causes amplifier 70 to increase VOUT, thereby increasing the proportion of load current it supplies to the DUT load.

The +SENSE bus signal indicating the supply voltage at the DUT terminals passes through a transistor 45 and a resistor 44 within sense control circuit 60 to become the VSEN input to amplifier 70. During a test, when the EN' output of enable controller 47 has fully turned FET transistor 48 on, the EN' signal also turns on a transistor 62 within sense control circuit 50 that drives the base of transistor 45 via a resistor 64. A diode 66 coupled between the base of transistor 45 and the +V line keeps the base voltage of transistor 45 sufficiently higher than the +SENSE bus voltage to turn transistor 45 on when transistor 62 is on. When transistor 45 is on it has very low collector-emitter impedance and the small resistor 44 provides the only substantial impedance between +SENSE and the VSEN input to power supply 30. Diode 66 is preferably implemented by a diode-connected bipolar junction transistor identical to transistor 45 to optimize Vbe voltage matching.

During a test, the feedback provided by the +SENSE signal helps power supply 30 maintain the DUT supply voltage indicated by the +SENSE signal at the appropriate voltage level. But during power system startup at the beginning of the connect cycle, when transistor 48 is not fully on, the +SENSE bus signal voltage is very low. If transistor 45 were not in the feedback path between +SENSE and the inverting input of amplifier 70, then during system startup amplifier 70 would overdrive VOUT in an attempt to compensate for the low value of +SENSE. In such case protection circuits within power supply 30 would shut down amplifier 70 and the power supply system would be unstable. However with transistor 45 in the +SENSE signal feedback path, the transistor's initially high collector-emitter impedance reduces +SENSE signal feedback to amplifier 70 so the +SENSE signal has little influence on VOUT. As the EN' output signal of enable control circuit 46 ramps up to slowly turn FET transistor 48 on, the +SENSE signal voltage rises closer to VREF and transistor 45 slowly turns on, thereby reducing its collector-emitter impedance and providing more +SENSE signal feedback to amplifier 70. This slow increase in the amount of +SENSE signal feedback as +SENSE signal voltage approaches VREF prevents amplifier 70 from over driving VOUT during the initial stage of power system startup, thereby contributing to power supply system stability during start up.

Figure 3:
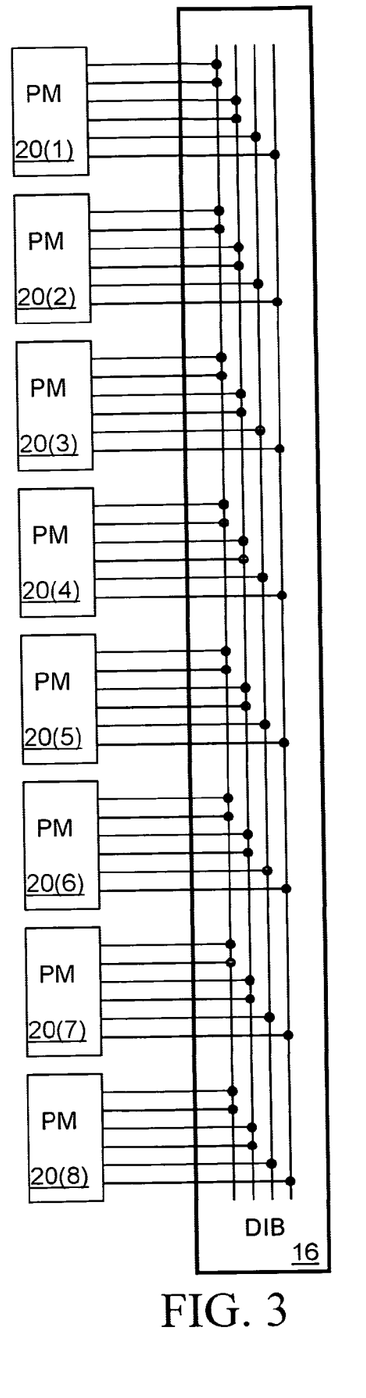
FIGS. 3 and 4 are schematic diagrams of alternative arrangements of four buses implemented on the device interface board of FIG. 1.
Figure 4:
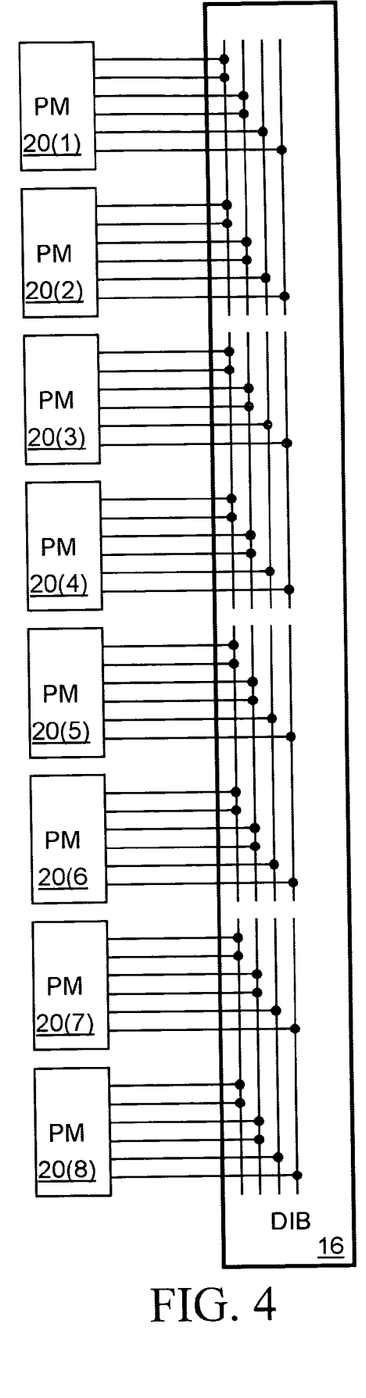

Power modules 20(1)–2(N) can be organized into one or more load-sharing groups in which all members of each group share the same load. To do so the buses on DIB 16 (FIG. 1) are configured so that all power modules 20(1)–20(N) included in the same load-sharing group are connected to the same set of +V, +SENSE, LS, –SENSE, –V and GP_EN buses on DIB 16. The pattern of +V, +SENSE, LS, –SENSE, –V and GP_EN buses on DIB 16 solely determines which of power modules 20(1)–20(N) are assigned to the same load-sharing group. For example, FIG. 3 illustrates an example where, assuming the number N of power modules of FIG. 1 is 8, all eight power modules 20(1)–20(8) share the same load group. Here DIB 16 connects all power modules 20(1)–20(8) to the same set of +V, +SENSE, LS, –SENSE, –V and GP_EN buses. FIG. 4 shows an example in which the eight power modules 20(1)–20(8) are organized into four separate load sharing groups of two modules each. In that example DIB 16 provides four separate sets of +V, +SENSE, LS, –SENSE, –V and GP_EN buses with each pair of modules 20 being connected to a separate bus set.

FPGA 26, mounted on power distribution board 22 (FIG. 1), can control and monitor power modules 20(1)–20(N) in real time. For example host computer 14 can configure FPGA 26 to sample and store voltage and current levels monitored by ADCs 36 and 38 or to disable the power supply 30 when the OC signal output of comparator 42 indicates an over-current problem. Since host computer 14 can program FPGA 26, it can change the way FPGA 26 uses the data routing resources of buses B(1)–B(N). Such programmability is beneficial because it allows for evolution of power modules 20 that require changes in the way they communicate with host computer 14. Also when not all power modules 20(1)–20(N) are needed, some of them can be replaced in their slots with cards having other functions, such as for example, cards for supplying highly accurate reference voltages to the DUTs, cards for carrying out parametric or other types of tests on the DUTs, or cards containing equipment for calibrating tester channel signal timing. In such case, FPGA can be programmed to communicate though buses B(1)–B(N) in a manner that is appropriate for those cards.

Figure 5:
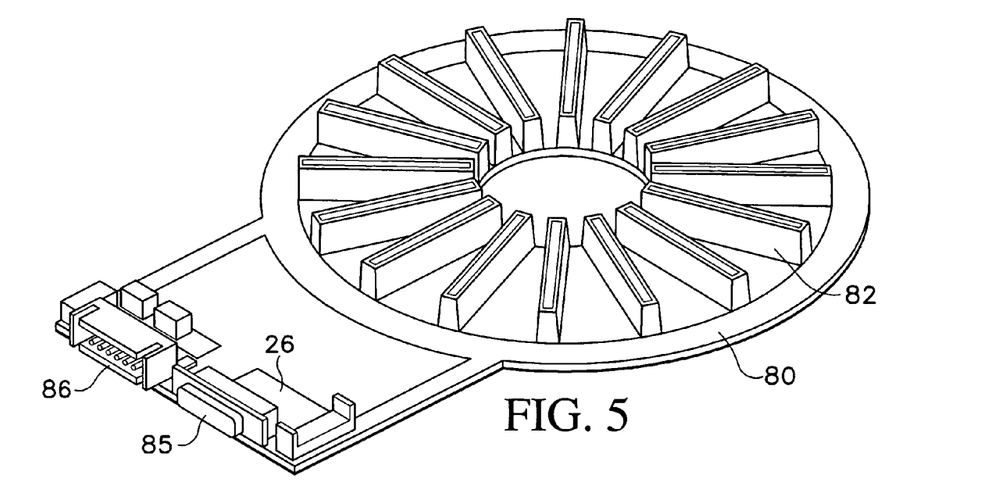
FIGS. 5–9 are perspective views of a test head forming a part of the integrated circuit tester of FIG. 1 in successive stages of construction.

FIGS. 5–9 are perspective views of an example test head 80 in accordance with the invention in successive stages of its construction. As best seen in FIG. 5, test head 80 includes the circular power distribution board 22 including traces (not shown) implementing buses B(1)–B(N) for linking an FPGA 26 to connectors 82 in which power module cards 81 are mounted and a cable connector 85 for linking FPGA 26 to the external host computer 14 (FIG. 1). Other traces (not shown) on power distribution board 22 deliver +48V and +12V power and ground from a connector 86 to connectors 82. A cable (not shown) links connector 86 to main power supply 18 (FIG. 1).

Figure 6:
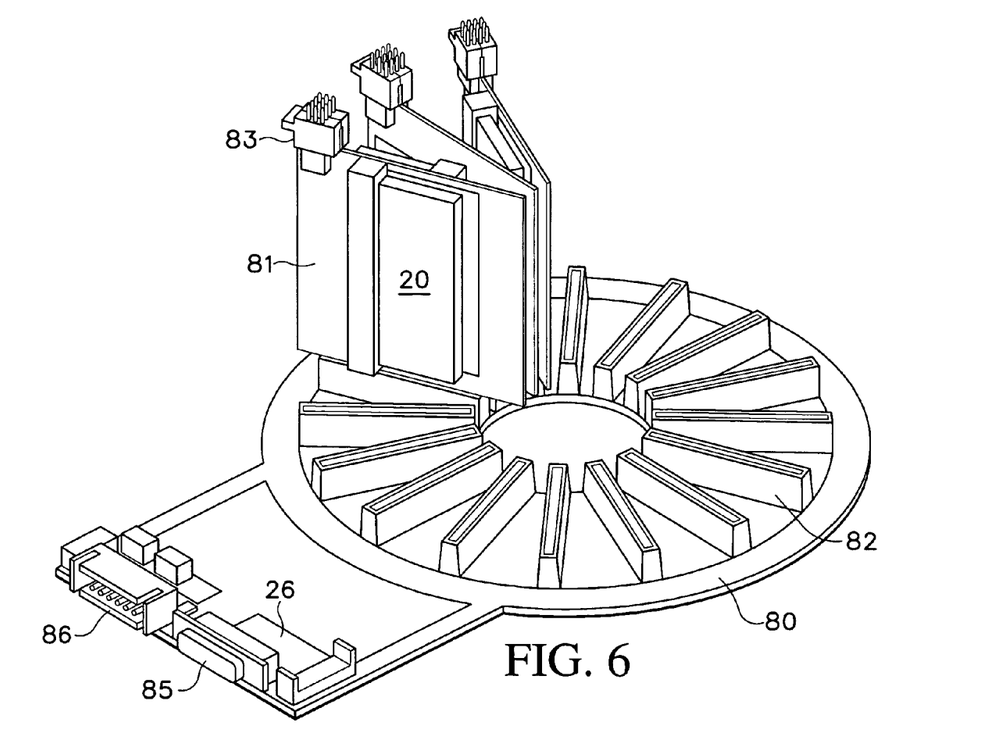
Figure 7:
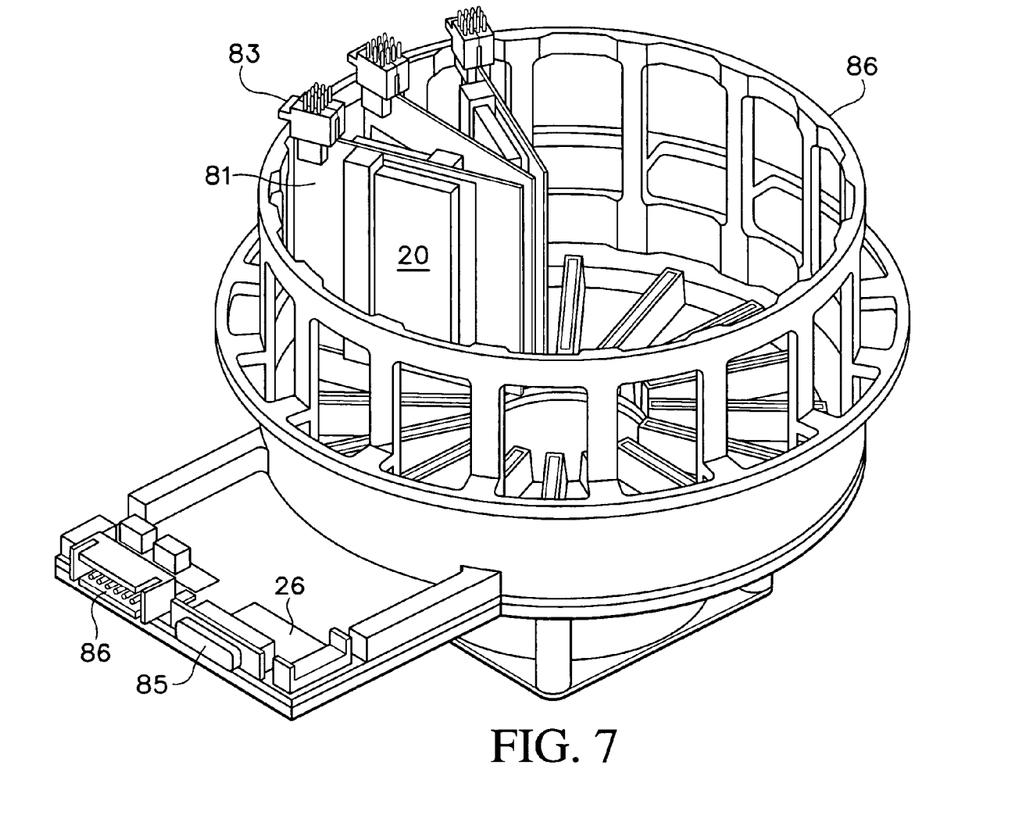
Figures 8, 9:
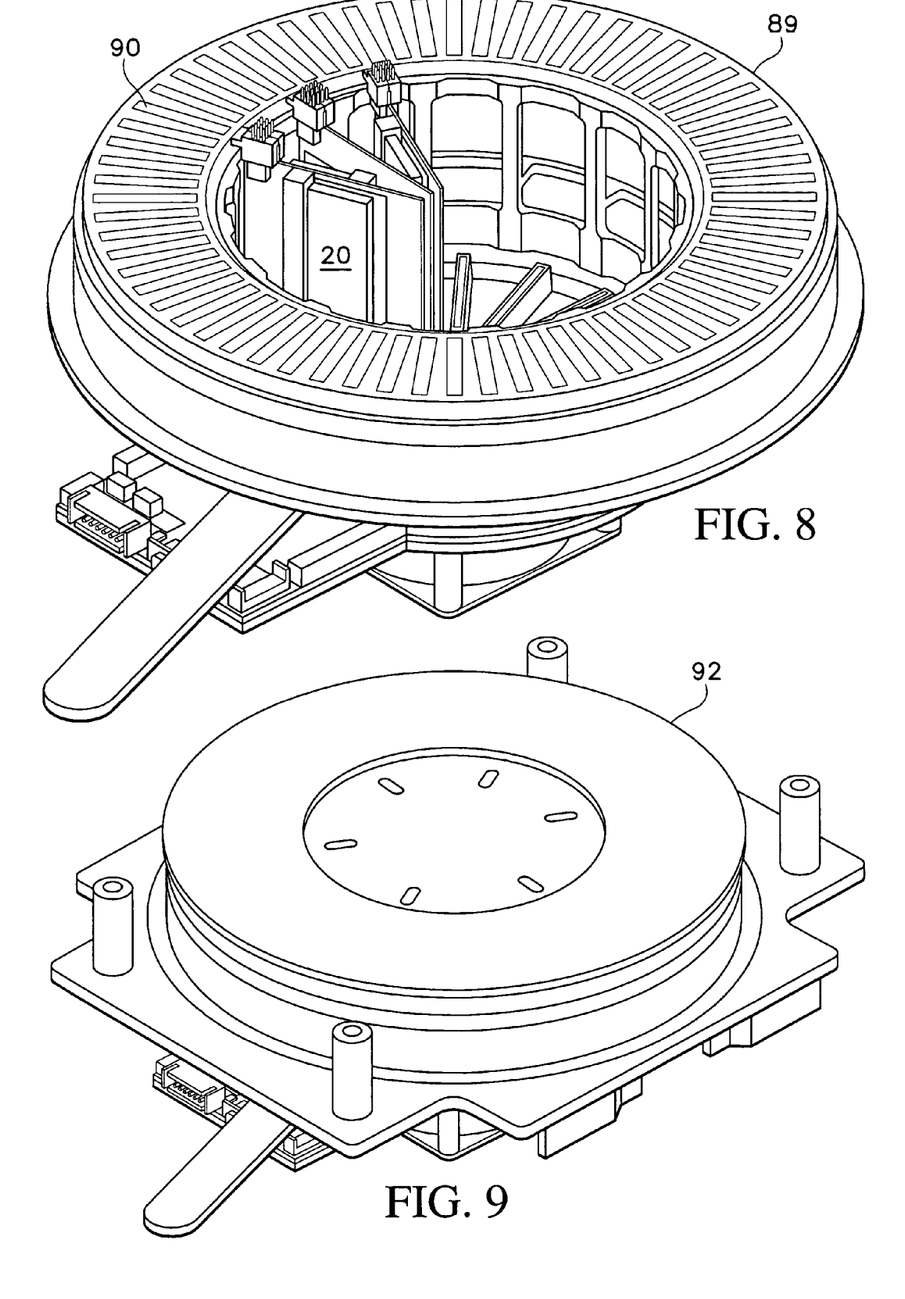

As shown in FIGS. 6–8, up to 16 power modules cards 81, may be installed in card connectors 82. With a power module 20 mounted on each side of each power module card 81, test head 80 may include up to 32 power modules. Pogo pin connectors 83 on the upper edge of each power module card 81 provide signal paths conveying the +V, +SENSE, LS, –SENSE, –V and GP_EN signals. between the power modules cards and pads on the under surface of device interface board 16 (FIG. 1).

As best seen in FIGS. 7 and 8, test head 80 includes an inner chassis 88 and an outer chassis 89 surrounding power module cards 81 for holding power distribution board 22 and for holding a set of connectors 90 providing signal paths between coaxial cables (not shown) and pads on the under surface of the device interface board 16 (FIG. 1). The coaxial cables convey test and response signal between connectors 89 and tester channels 10 (FIG. 1) mounted in a chassis (not shown) below test head 80. FIG. 9 shows the device interface board 16 mounted on top of connectors 83 and 89 (FIG. 8) and held in place by a cover 92. The DUTs may be mounted, for example, in IC sockets (not shown) residing in a central portion of the upper side of DIB 16. Traces and vias on DIB 16 connect power, ground and input/output terminals of the DUT(s) to the pads on the underside of DIB 16 contacted by connectors 83 and 89.

With power modules 20 positioned close to DIB 16 and connected to the DUT power and ground terminals through low impedance connectors 83 and short paths on DIB 16, the impedance between power module 20 and the DUT's power and ground terminals is very small. When several power modules 20 supply power and ground to the DUTs through several different paths, each path need convey only a small part of the current the DUT's draw. Thus the voltage drop through any one path is relatively small even when the DUTs are drawing substantial amounts of current. Even though current demand of the DUTs varies widely, the variation in voltage drop between modules 20 and the DUTs' power terminals is relatively small. Thus only relatively small regulating capacitance at the DUT's power terminals is sufficient to limit variation in the power supply voltage at those terminals.

The foregoing specification and the drawings depict exemplary embodiments of the best mode(s) of practicing the invention, and elements or steps of the depicted best mode(s) exemplify the elements or steps of the invention as recited in the appended claims. However those of skill in the art will appreciate that other embodiments of the invention are possible. For example while in the preferred embodiment of the invention the power supply 30 in each power modules 20 is implemented as a DC/DC converter, it may alternatively be implemented as an AC/DC converter. The power supply 30 can be supplied by DC voltages other than +12V or +48 v. The digital signals passing between power modules 20 and FPGA 26 via by buses B(1)–B(N) may convey other types of information. The controller implemented by FPGA 26 could be implemented by other kinds of logic devices, and need not necessarily be mound on power distribution board 22. Enable control circuit 47 and sense control circuit 60 can be implemented in various ways other than as illustrated in FIG. 2. The manner in which DIB 16 is implemented depends on the nature of the DUTs being tested. A DIB 16 for testing packaged DUTs DIB 16 may include sockets for holding the DUTS, while a DIB for testing unpackaged DUTs or DUTs still in the form of unseparated die on a semiconductor wafer include a probe system for accessing I/O and power terminals on DUT surfaces. The appended claims are therefore intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. An improved apparatus for testing an integrated circuit device under test (DUT) having a power input terminal for receiving current for powering the DUT, input terminals for receiving test signals, and output terminals for forwarding output signals that the DUT generates in response to the test signals, the apparatus comprising:

a plurality of tester channels for generating the test signals and for processing the DUT's output signals to determine how the DUT's output signals behave, a plurality of power modules, wherein each power module has a power output terminal and includes a power supply having a power supply output terminal connected to the power module's power output terminal, and the power supply is operative to develop a supply voltage at the power supply output terminal and to deliver an output current to the power supply output terminal, and a device interface structure for delivering the test signals from the tester channels to the DUT's input terminals, for delivering the DUT's output signals to the tester channels, and for delivering output current from the power output terminal of each power module to the DUT's power input terminal, and wherein the improvement resides in that:

the device interface structure includes a control signal conductor for delivering a control signal to at least some of the power modules, and each power module that receives the control signal is responsive to the control signal to adjust at least one of the supply voltage developed at the power module's power output terminal and the output current delivered to the power module's power output terminal.

2. The apparatus in accordance with claim 1 wherein the control signal is a sense signal of voltage proportional to a load voltage appearing at the DUT's power input terminal and the control signal conductor delivers the sense signal to each of the power modules, and the power supply of each power module responds to the sense signal by increasing the voltage developed at the power supply output terminal when the sense signal voltage is lower than a reference voltage and decreasing the voltage developed at the power supply output terminal when the sense signal voltage is higher than the reference voltage.

3. The apparatus in accordance with claim 1
wherein the control signal is a sense signal of voltage proportional to a load voltage appearing at the DUT's power input terminal and the control signal conductor delivers the sense signal to each of the power modules, wherein the apparatus further comprises a controller for communicating with the power modules via digital signals, wherein each power module includes a reference voltage source that is controlled by the controller via the digital signals and is operative to generate said reference voltage, and wherein the power supply of each power module responds to the sense signal by increasing the voltage developed at the power supply output terminal when the sense signal voltage is lower than the reference voltage and decreasing the voltage developed at the power supply output terminal when the sense signal voltage is higher than the reference voltage.

4. The apparatus in accordance with claim 3 wherein the reference voltage source of each power module is responsive to the digital signals to adjust the reference voltage.

5. The apparatus in accordance with claim 1 wherein the control signal is a load share signal of a voltage controlled by a power module that is currently supplying a higher output current at the power module's power output terminal than any other power module, and wherein the power supply in each other power module responds to the load share signal by increasing its output current when it is producing less output current than said higher output current.

6. The apparatus in accordance with claim 5 wherein each power module includes a current sensor circuit for producing a current control signal indicating the magnitude of the output current supplied by the power supply of that power module and a load share control circuit responsive to the current control signal and the load share signal to adjust the supply voltage developed by the power supply.

7. The apparatus in accordance with claim 1
   wherein each power module includes an adjustable impedance element connected between the power supply output terminal and the power module's power output terminal,
   wherein each power module has an input enable terminal for receiving an input enable signal that enables the power supply of that power module when the input enable signal is asserted and disables the power supply of that power module when the input enable signal is de-asserted,
   wherein the power supply of each power module develops the supply voltage at the power supply output terminal when enabled and does not develop the supply voltage at the power supply output terminal when disabled, and
   wherein each power module further comprises an enable control circuit for setting the adjustable impedance element of that power module to a low impedance after the input enable signal is asserted and for setting the adjustable impedance element of that power module to a high impedance when the input enable signal is de-asserted.

8. The apparatus in accordance with claim 7 wherein the adjustable impedance element of each power module is a transistor.

9. The apparatus in accordance with claim 7
   wherein the enable control circuit of each power module has a group enable terminal,
   wherein the control signal conductor is connected to the group enable terminals of the enable control circuits of the power modules respectively for delivering a group enable signal to the enable control circuits,
   wherein the enable control circuit of each power module sets the group enable signal to a first state when the power module's input enable signal is de-asserted, and allows the group enable signal to go to a second state with a fixed delay after the power module's input enable signal is asserted, and
   wherein the enable control circuit of each power module changes the adjustable impedance element of that power module from a high impedance to a low impedance when the group enable signal changes from the first state to the second state.

10. The apparatus in accordance with claim 9
    wherein the adjustable impedance element of each power module is a transistor,
    wherein state changes in the group enable signal drive a control terminal of the transistor, such that the transistor is off when the group enable signal is of the first state and is on when the group enable signal is of the second state, and
    wherein the apparatus further comprises at least one capacitor connected to the control signal conductor for substantially slowing a change in state in the group enable signal from the first state to the second state so that the transistor gradually turns on.

11. The apparatus in accordance with claim 9
    wherein the device interface structure includes a load share signal conductor for conveying a load share signal among the power modules and a sense signal conductor for conveying a sense signal to the power modules.

12. The apparatus in accordance with claim 7 further comprising a controller for communicating with the power modules via digital signals, wherein the digital signals include the input enable signal supplied to each power module.

13. The apparatus in accordance with claim 7
    wherein the control signal is a sense signal of voltage proportional to a load voltage appearing at the DUT's power input terminal and the control signal conductor delivers the sense signal to each of the power modules,
    wherein each power module includes a sense control circuit that is responsive to the enable control circuit and the sense signal for generating a voltage feedback signal,
    wherein the power supply of each power module responds to the voltage feedback signal by increasing the voltage developed at the power supply output terminal when the voltage feedback signal voltage is lower than a reference voltage and decreasing the voltage developed at the power supply output terminal when the voltage feedback signal voltage is higher than the reference voltage,
    and wherein the sense control circuit generates the voltage feedback signal by attenuating the sense signal in response to the enable control circuit,
    whereby when the power module receives the input enable signal, the voltage developed at the power supply output terminal increases concurrently with a decrease in the impedance of the adjustable impedance element.

14. The apparatus in accordance with claim 13 further comprising:
    a power distribution board installed in the chassis and including a power connector, and
    a main power supply for supplying operating power at an output of the main power supply,
    wherein the power module cards are installed on the power distribution board, and
    wherein the output of the main power supply is connected to the power connector of the power distribution board for supplying operating power to the power connector, and the power distribution board delivers the operating power from the power connector to the power module cards.

15. The apparatus in accordance with claim 14 wherein the main power supply supplies DC power and the power supply in each power module comprises a DC/DC converter.

16. The apparatus in accordance with claim 1 further comprising:
    a chassis, and
    a plurality of power module cards installed in the chassis and each holding at least one of the power modules.

17. The apparatus in accordance with claim 16
    wherein the device interface structure comprises a circuit board having a surface upon which reside a plurality of conductive pads,
    wherein the device interface structure includes a DUT power supply terminal for connection to the DUT's power input terminal and a power conductor that connects the conductive pads to the DUT power supply terminal, and
    wherein the power module cards comprise connectors that connect the power output terminals of the power modules to the conductive pads of the device interface structure.

18. The apparatus in accordance with claim 17 wherein the device interface structure includes a socket for holding the DUT.

19. The apparatus in accordance with claim 16
wherein the device interface structure comprises a circuit board having a surface upon which reside a plurality of conductive pads,
wherein the conductive pads of the device interface structure are connected to the control signal conductor, and
wherein the power module cards comprise connectors that contact the conductive pads for delivering the control signal.

20. The apparatus in accordance with claim 19 wherein the control signal is a sense signal of voltage proportional to a load voltage appearing at the DUT's power input terminal, or a load share signal of a voltage controlled by a power module that is currently supplying a higher output current at the power module's power output terminal than any other power module.

21. The apparatus in accordance with claim 1 further comprising:
a controller for communicating with the power modules via digital signals.

22. The apparatus in accordance with claim 21 further comprising:
a motherboard, and
a plurality of power module cards, each installed on the motherboard and holding at least one of the power modules, and
wherein the controller is mounted on the motherboard and the motherboard and the power module cards convey the digital signals between the controller and the power modules.

23. The apparatus in accordance with claim 21 wherein each power module transmits data to the controller via the digital signals indicating at least one of the output current of the power supply of that power module and a load voltage appearing at the DUT's power input terminal.

24. The apparatus in accordance with claim 21
wherein the supply voltage is adjustable,
wherein the control signal is a sense signal of voltage proportional to a load voltage appearing at the DUT's power input terminal to each power module,
wherein each power module generates a reference voltage controlled by the controller via the digital signals, and
wherein the power supply of each power module increases the power supply's adjustable supply voltage when the sense signal voltage is lower than the reference voltage and decreases the adjustable supply voltage when the sense signal voltage is higher than the reference voltage.

25. The apparatus in accordance with claim 21
wherein the device interface structure delivers a sense signal of voltage proportional to a load voltage appearing at the DUT's power input terminal to each power module,
wherein each power module generates a reference voltage controlled by the controller via the digital signals, and
wherein the controller uses the digital signals to adjust the reference voltage generated by each power module.

* * * * *